United States Patent [19]
Fonash et al.

[11] Patent Number: 6,165,875
[45] Date of Patent: *Dec. 26, 2000

[54] METHODS FOR MODIFYING SOLID PHASE CRYSTALLIZATION KINETICS FOR A-SI FILMS

[75] Inventors: Stephen J. Fonash, State College, Pa.; Reece Kingi, Auckland, New Zealand; Ali K. Kalkan, State College, Pa.

[73] Assignee: The Penn State Research Foundation, University Park, Pa.

[ * ] Notice: This patent issued on a continued prosecution application filed under 37 CFR 1.53(d), and is subject to the twenty year patent term provisions of 35 U.S.C. 154(a)(2).

[21] Appl. No.: 08/835,695

[22] Filed: Apr. 10, 1997

Related U.S. Application Data

[60] Provisional application No. 60/015,248, Apr. 10, 1996.

[51] Int. Cl.$^7$ .............................. H01L 21/20; B05D 3/06
[52] U.S. Cl. ......................... 438/486; 438/482; 427/508; 427/509; 427/521; 427/559; 427/125; 427/255.18; 427/255.27; 427/376.2
[58] Field of Search ..................... 427/508, 509, 427/521, 559, 574, 578, 125, 123, 255.1, 344, 376.2, 404, 419.1, 535, 576, 255.18, 255.27; 438/482, 486

[56] References Cited

U.S. PATENT DOCUMENTS

| | | | |
|---|---|---|---|
| 5,017,508 | 5/1991 | Dodt et al. | 437/173 |
| 5,147,826 | 9/1992 | Liu et al. | 437/233 |
| 5,302,230 | 4/1994 | Ino et al. | 156/603 |
| 5,336,641 | 8/1994 | Fair et al. | 437/248 |
| 5,470,619 | 11/1995 | Ahn et al. | 427/578 |
| 5,481,121 | 1/1996 | Zhang et al. | 257/64 |
| 5,614,257 | 3/1997 | Beinglass et al. | 427/248.1 |
| 5,624,203 | 4/1997 | Ohtani et al. | 428/97 |
| 5,654,203 | 8/1997 | Ohtani et al. | 438/97 |
| 5,733,369 | 3/1998 | Yonehara et al. | 117/89 |
| 5,808,321 | 9/1998 | Mitanaga et al. | 257/72 |

FOREIGN PATENT DOCUMENTS

| | | |
|---|---|---|
| 59-155121 | 9/1984 | Japan . |
| 60-21807 | 2/1985 | Japan . |
| 7-106247 | 4/1995 | Japan . |

OTHER PUBLICATIONS

"Low–Temperature Fabrication of High–Mobility Poly–Si TFT's for Large–Area LCD's", By T. Serikawa, et al., 1989, *IEEE Transactions on Electron Devices*.

"A Comparison of Polysilicon Produced By Excimer (ArF) Laser Crystallisation and Low–Temperature (600°C) Furnace Crystallisation of Hydrogenated Amorphous Silicon (a–Si:H)", By T. E. Dyer, et al., 1994, *Solid State Phenomena*.

"Crystallisation Behaviour of Amorphous Thin Si Films Produced by Low Pressure Chemical Vapor Deposition", By J. P. Guilllemet, et al., 1994, *Solid State Phenomena*.

(List continued on next page.)

*Primary Examiner*—Shrive Beck
*Assistant Examiner*—Michael Barr
*Attorney, Agent, or Firm*—Thomas J. Monahan

[57] ABSTRACT

This invention is directed toward methods for fabricating polycrystalline thin films. More particularly, the invention is directed toward optimized solid phase crystallization of plasma enhanced chemical vapor deposited amorphous silicon thin films as a means for obtaining, with a low thermal budget, polycrystalline silicon thin films comprising larger grain sizes and smoother surfaces. The process of plasma enhanced chemical vapor deposition is quantified for silane containing various types of dilutants, thereby allowing deposition temperature, type of dilutant, type of plasma and other parameters to be controlled to yield the desired crystallization grain size at the desired thermal budget. Methods of annealing, annealing temperature, and pre-annealment treatments are also quantified such that grain size and thermal budget can be controlled in the fabrication of polycrystalline silicon thin films. Methods and apparatus for the select regional crystallization of an originally amorphous thin film using photon radiation is disclosed, wherein these methods and apparatus yield polycrystalline thin films with maximum grain size at a minimum thermal budget.

9 Claims, 8 Drawing Sheets

OTHER PUBLICATIONS

"Effect of Substrate Temperature on Recrystallization of Plasma Chemical Vapor Deposition Amorphous Silicon Films", By K. Nakazawa, et al., 1990, *Journal of Applied Physics*.

"Determination of Crystallisation Parameters of a–Si From In Situ Conductance Measurements and Transmission Electron Microscopy Analysis", By T. Kretz et al., *Solid State Phenomena*.

"Polycrystalline Silicon Thin Film Transistors for Liquid Crystal Displays", By I–Wei Wu, 1994, *Solid State Phenomena*.

METHODS FOR MODIFYING SOLID PHASE CRYSTALLIZATION KINETICS FOR A-SI FILMS

This application claims the benefit of U.S. Provisional Application 60/015,248 filed Apr. 10, 1996.

This invention was made with Government support under ARPA Grant No. F33615-94-1-1464 awarded by the U.S. Department of the Air Force. The Government has certain rights in the invention.

BACKGROUND OF THE INVENTION

1. Field of The Invention

This invention is directed toward methods for fabricating polycrystalline thin films. More particularly, the invention is directed toward optimized solid phase crystallization of plasma enhanced chemical vapor deposited amorphous silicon thin films as a means for obtaining, with a low thermal budget, polycrystalline silicon thin films comprising larger grain sizes and smother surfaces.

2. Background Of The Art

Polycrystalline silicon (poly-Si) thin film transistors are currently receiving considerable attention in the art for use in active matrix flat panel display technology. This application is discussed in the literature by I-Wie Wu, *Solid State Phenomena*, vols. 37–38 (1994), pp. 553–564, by K. Nakazawa and K. Tanaka, *Journal of Applied Physics*, 68 (3), 1990, pp. 1029, by T. Kretz et al, *Solid State Phenomena*, vols. 37–38 (1994), pp. 311–316, and by J. Guillemet et al, *Solid State Phenomena*, vols. 37–38 (1994), pp. 293–298.

In the fabrication of poly-Si thin film, it is desirable, from a performance viewpoint, to maximize the grain size and to maximize the smoothness of the surface. From technical, operational and economic viewpoints, it is desirable to minimize the thermal budget in the fabrication of the thin films.

Grain boundaries within a poly-Si film generally deteriorate the electronic properties of the film. It is well known in the prior art that these grain boundaries can be passivated by hydrogen, but the development of the present invention revealed that this hydrogen can be unstable in severe environmental conditions. It is, therefore, desirable to have as few grain boundaries as possible in many applications of polycrystalline materials. In order to reduce the number of grain boundaries present in the film, large grain sizes are desired, and thereby improve electronic properties of the poly-Si films.

The crystallization of thin deposited amorphous silicon films, to obtain thin poly-Si film, requires a relatively large thermal budget. This limits the maximum throughput of the fabrication of devices and restricts the range of substrates that can be used. Therefore, a reduction in crystallization thermal budget is necessary in the manufacturing of low cost, large area devices such as poly-Si thin film transistors for applications such as flat panel displays and for solar cell arrays.

The solid phase crystallization (SPC) of plasma enhanced chemical vapor deposited (PECVD) amorphous silicon (a-Si) thin films is a promising approach for obtaining polycrystalline silicon (poly-Si) films, as opposed to depositing them directly, with the goal of obtaining larger grains and smother surfaces, and also with a lower thermal budget. Solid phase crystallization offers advantages over prior art laser crystallization that include smoother poly-Si surfaces, higher thermal throughputs for rapid solid phase crystallization, and better grain uniformity. On the other hand, thin film transistors fabricated from laser crystallized a-Si have much higher mobilities than those fabricated from solid phase crystallized a-Si, which is a direct result of the lower intergrannular defect density as shown by T. E. Dyer, *Solid State Phenomena*, vols. 37–38 (1994). pp. 329, and by T. Sameshima, *Journal of Applied Physics*, 76 (11), 1990, pp. 7737.

Based upon the prior art, it is of great interest to study the SPC kinetics of PECVD deposited a-Si thin films, and from this study develop methods for modifying the kinetics to improve the poly-Si quality for thin film transistor applications, and also to reduce the thermal budget required to fabricate the films.

An object of the present invention is to provide methods for varying PECVD depositional parameters to optimize quality of poly-Si film for thin film transistor applications and to minimize thermal budget.

Another object of the invention is to provide methods for using both furnace annealing and rapid thermal annealing or rapid thermal processing of the deposited film in order to optimize the quality of poly-Si film for thin film transistor applications and to minimize thermal budget, where thermal budget is define as the product of annealing temperature and annealing time.

Yet another object of the invention is to provide methods for pre-annealing surface treatments to optimize quality of poly-Si film for thin film transistor applications and to minimize thermal budget.

Another object of the invention is to enhance rapid thermal annealing process with a source of high energy, high intensity photon radiation thereby further reducing the required thermal budget.

Still another object of the present invention is to provide apparatus and methods for crystallization of selected regions of initially amorphous thin films.

Yet another object of the invention is to maximize grain size and minimize thermal budget of polycrystalline file by the introduction of seed nuclei sites using selective crystallization techniques.

There are other objects of the present invention which will become apparent in the following disclosure.

SUMMARY OF THE INVENTION

The SPC kinetics of PECVD deposited a-Si thin film have been studied. Various parameters affect the grain size of the film and the thermal budget of the fabrication process. Methods will be disclosed for optimizing these parameters in order to obtain the stated goals of maximum grain size and/or minimum thermal budget.

In the process of studying PECVD kinetics multiple a-Si thin films were deposited on glass substrates from pure and diluted silane ($SiH_4$) using a capacitively coupled radio frequency PECVD system. The deposition temperature and pressure were varied, as well as the deposition rates. All other parameters were held constant.

Spectroscopic ellipsometry (SE) was performed on sections of deposited films to determine the relative microvoid density as a function of PECVD depositional parameters. Films were then annealed in a conventional furnace and in a rapid thermal processing (RTP) system in an $N_2$ ambient over a range of annealing temperatures. In each case, temperatures of the a-Si samples were monitored with thermocouples. In addition some films were subjected to pre-anneal surface treatments, which featured the deposition of either nickel (Ni) or palladium (Pd) onto the film surface, or the exposure of the film surface to high density plasmas. The thin metal layers were deposited using a high vacuum thermal evaporation system, and the high density plasma source was an ASDTeX electron cyclotron resonance system. The ultra violet (UV) reflectance technique, as described by T. Kammins, *Polycrystalline Silicon for IC Applications,* Klumer Academic Publishers, 1988, was used to determine the degree of crystallinity of all annealed films, and a transmission electron microscope (TEM) was used to determine the grain size of all fully crystallized films.

Effects of PECVD Deposition Parameters

As a background, the degree of crystallinity versus annealing time for a-Si thin films on substrates begins with a transient or incubation period, during which time no crystallization is observed. Nucleation then begins, and grains grow laterally outwardly from these nucleation sites until they impinge upon adjacent grains, at which point crystallization is completed. The period of time between the end of the transition period and the total crystallization time is hereafter referred to as the growth period or growth time.

The effects of PECVD depositional parameters are first summarized. The total crystallization time was found to be shorter for films deposited from a $SiH_4:H_2$ source gas mixture, but did not exhibit a specific trend as a function of temperature. The growth period, during which time the nucleation and grain growth process occurred, increased slightly with decreasing depositional temperature, was longest for a $SiH_4:Ar$ source gas mixture, and was shortest for a $SiH_4:H_2$ source gas mixture. It was found that grain size increases as the depositional temperature is reduced, and that grain size is largest for $SiH_4:Ar$ source gas mixtures and lowest for $SiH_4:H_2$ source gas mixtures. Physically speaking, as the growth period increases, nucleation occurs over a longer period of time, and because the grain size increases, it follows that the total number of nuclei that form per unit area decreases. Stated another way, grain size increases as the nucleation rate decreases. The correlations between grain size, growth time, nucleation rate and depositional parameters were not observed for the transient period (defined above), suggesting the state of the film/glass interface dominates in determining this time period.

Relative microvoid density for various PECVD deposition conditions were determined from spectroscopic ellipsometry (SE). These results showed that as the depositional temperature is reduced, or as the source gas mixture is changed from $SiH_4:H_2$ to pure $SiH_4$, or changed from pure $SiH_4$ to $SiH_4:Ar$, the relative microvoid density in the film increases. Furthermore, it is well known that as the deposition temperature is reduced, or as the deposition rate is increased, the structural disorder in the a-Si film increases and the resulting nucleation rate decreases resulting in increased grain size. This disclosure, therefore, sets forth methods for controlling both temperature and source gas dilution to affect disorder and subsequent crystallization of the thin film.

The effects of PECVD depositional parameters upon the properties of the fabricated thin films will be discussed in detail in subsequent sections, with experimental data being presented to justify the methods of the invention.

Effects of Pre-Anneal Surface Treatments

Attention is next directed to the effects of pre-anneal surface treatments upon the properties of thin a-Si films. Pre-annealing surface treatments were compared for a-Si film deposited from both hydrogen and argon diluted silane ($SiH_4$). More specifically, crystallization time and grain size of a-Si films were determined as a function of depositional temperature for several source gas mixes and several applied pre-anneal surface treatments.

It was found that metal-catalyzed crystallization treatments of various diluted films has a very dramatic impact on crystallization time. The reductions in crystallization time are much larger than any reductions seen previously in the prior art on non-diluted films. This observation suggests synergism between these metal treatments and source gas dilution. Furthermore it has been shown that, in general, the greater reduction in thermal budget, the greater reduction in grain size, for both metal and plasma pre-annealed surface treatments. Pre-annealing, therefore, creates a trade-off situation between desired increased grain size and the desired decreased thermal budget.

Prior art studies have concluded from experimental observations that Ni and Pd overlays result in the formation of a silicide at a relatively low temperature, and that this silicide induces nucleation. The reduction in thermal budget resulting from pre-annealing plasma surface treatments has also been studied in the prior art, however these studies did not use diluted films. It was postulated in these studies that plasma treatments increase the stored energy in the surface of the a-Si film, in the form of strained and broken Si—Si bonds. This energy then aids the nucleation process upon annealing. Methods of the present invention show that plasma treatments on diluted films produce almost the same reduction in crystallization time, and hence reduction in thermal budget, reported in prior art plasma treatments of non-diluted films. Methods of the present invention show, however, that the metal treatments dramatically lower the crystallization times much more so than for this treatment applied to non-diluted films.

The effects of pre-annealing surface treatments upon the properties of the fabricated thin films will be discussed in detail in subsequent sections, with experimental data being presented to justify the methods of the invention.

Effects of Annealing Technique and Temperature

Attention is now directed toward the effects of annealing techniques and annealing temperatures of the thin film.

Properties of films a-Si film deposited from a given source gas at a given depositional temperature were determined as a function of annealing temperature, where the films were annealed in both a conventional furnace and in RTP systems. It was found that for either furnace annealing or rapid thermal annealing (RTA), the crystallization time is an annealing temperature activated process, and that the resulting poly-Si grain size is inversely proportional to the annealing temperature. Both of these phenomena have been observed in the prior art, and can be explained by considering nucleation and grain growth kinetics.

The present invention sets forth methodology to relate grain size to the method of annealing, for a given annealing temperature. More specifically, it was found that for a given annealing temperature, RTA results in lower crystallization times, but with smaller grain size than furnace annealing. Again, a trade off situation arises between maximum grain size and minimum temperature budget. Two explanatory models for this phenomena are set forth in subsequent sections of this disclosure.

The present invention sets forth methods for further reducing the thermal crystallization budget by combining RTP with a high energy, high intensity photon flux.

In summary, the PECVD deposition conditions affect the SPC kinetics of a-Si thin films. As the deposition rate is increased, or as the source gas mixture is changed from $SiH_4:H_2$ to pure $SiH_4$, or from pure $SiH_4$ to $SiH_4:Ar$, the nucleation rate decreases resulting in an increase in grain size. In addition, thermal budget reduction is offered by pre-anneal surface treatments when applied to diluted films. The thermal budget reduction occurs as a result of enhanced nucleation rate which, in turn, results in smaller poly-Si grain size thereby creating a trade-off situation. Finally, RTA has been found to modify the kinetics of SPC, in general terms. RTA reduces the thermal budget, at the expense of smaller grain size, more than furnace annealing at a given annealing temperature. RTA can be combined with a flux of high energy, high intensity photons to further reduce the total thermal budget.

BRIEF DESCRIPTION OF THE DRAWINGS

So that the manner in which the above recited features, advantages and objects of the present invention are attained and can be understood in detail, more particular description of the invention, briefly summarized above, may be had by reference to the embodiments thereof which are illustrated in the appended drawings.

It is to be noted, however, that the appended drawings illustrate only typical embodiments of the invention and are therefore not to be considered limiting of its scope, for the invention may admit to other equally effective embodiments.

DETAILED DESCRIPTION OF THE PREFERRED EMBODIMENTS

As stated previously, a plurality of parameters affect the grain size and temperature budget in poly-Si thin film fabrication. The present invention is directed toward methods for the maximization of grain size, and/or the minimization of temperature budget, in the thin film fabrication process. In order to accomplish this goal, it was necessary to develop models of the functional dependence of the parameters of interest upon controllable parameters in the fabrication process. Experimental procedures used to determine these relationships are disclosed below. In addition, functional dependence of grain size, or temperature budget, as a function of controllable parameters, will be developed in separate subsections in the disclosure.

Experimental Procedure

In the process of studying PECVD kinetics to develop the desired fabrication models, eleven 100 angstrom (Å) a-Si thin films were deposited onto Corning code 7059 glass substrates from pure $SiH_4$, $SiH_4$ diluted with argon ($SiH_4:Ar$) and $SiH_4$ diluted with hydrogen ($SiH_4:H_2$), using a capacitively coupled radio frequency PECVD system. The depositional temperature and pressure were varied between 290 and 130 degrees Centigrade (° C.). The depositional pressure was 0.5 Torr for pure $SiH_4$, and 1 Torr for $SiH_4:Ar$ and $SiH_4:H_2$ mixtures of depositional source gases. The deposition rates for pure $SiH_4$, $SiH_4:H_2$, and $SiH_4:Ar$ were 2.4 Å/sec, 0.87 Å/sec and 3.3 Å/sec, respectively. All other parameters were held constant.

Spectroscopic ellipsometry (SE) was performed on a selection of deposited film samples to determine the relative microvoid density as a function of PECVD depositional parameters. Films were then annealed in a conventional furnace and in a rapid thermal processing (RTP) system in an $N_2$ ambient gas over a range of temperatures. In each case, the temperature was monitored with k-type thermocouples positioned next to the a-Si samples. In addition, some films were subject to pre-furnace-anneal surface treatments, which consisted of the deposition of 15 Å of either nickel (Ni) or palladium (Pd) onto the film surface, or the exposure of the film surface to high density $N_2$ or He plasmas. The thin metal layers were deposited using a high vacuum thermal evaporation system, and the high density plasma source was an ASDTeX electron cyclotron resonance system. The ultra violet (UV) reflectance technique, as described by T. Kammins. *Polycrystalline Silicon for IC Applications,* Klumer Academic Publishers, 1988, was used to determine the degree of crystallinity of all annealed films, and a transmission electron microscope (TEM) was used to determine the grain size of all fully crystallized films.

Effects of PECVD Deposition Parameters

As stated previously, the degree of crystallinity versus annealing time for a-Si thin films on substrates begins with a transient or incubation period, during which time no crystallization is observed. Nucleation then begins, and grains grow laterally outwardly from these nucleation sites until they impinge upon adjacent grains, at which point crystallization is completed. The period of time between the end of the transition period and the total crystallization time is hereafter referred to as the growth period or growth time.

Figure 1A:
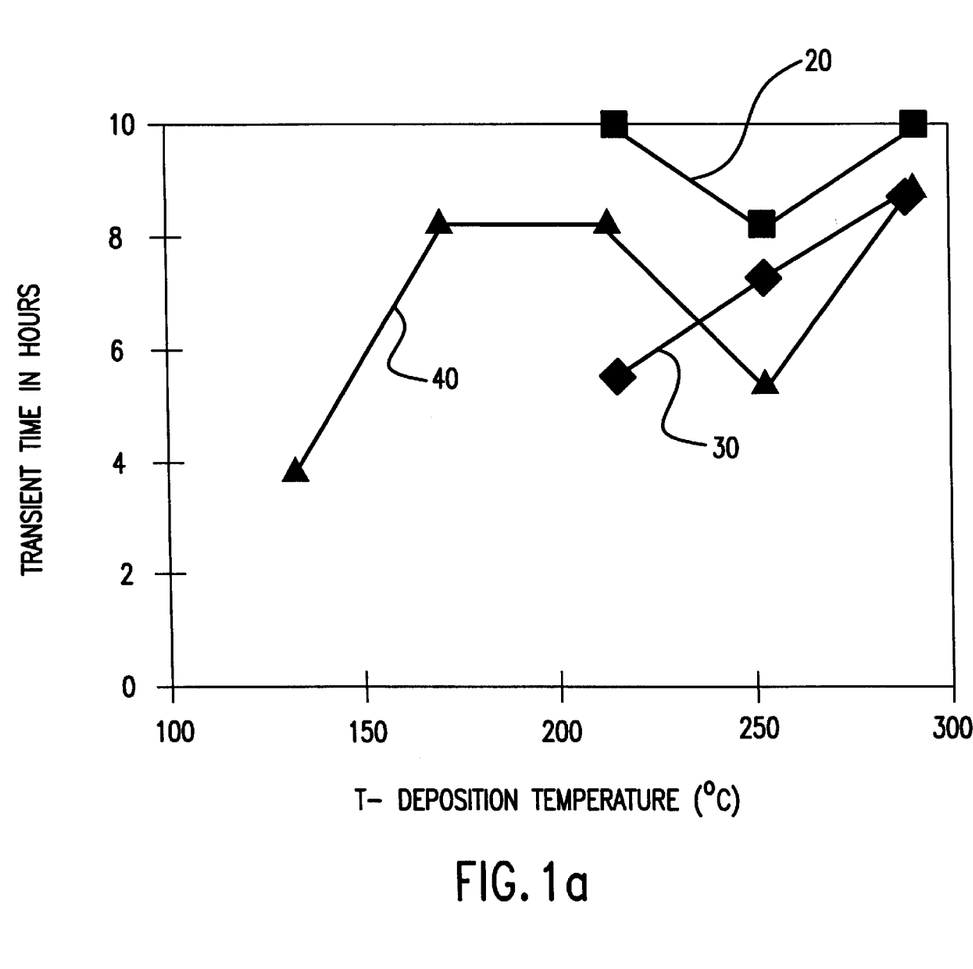
FIG. 1a shows transition time as a function of deposition temperature for a-Si film deposited from three different source gases.
Figure 1B:
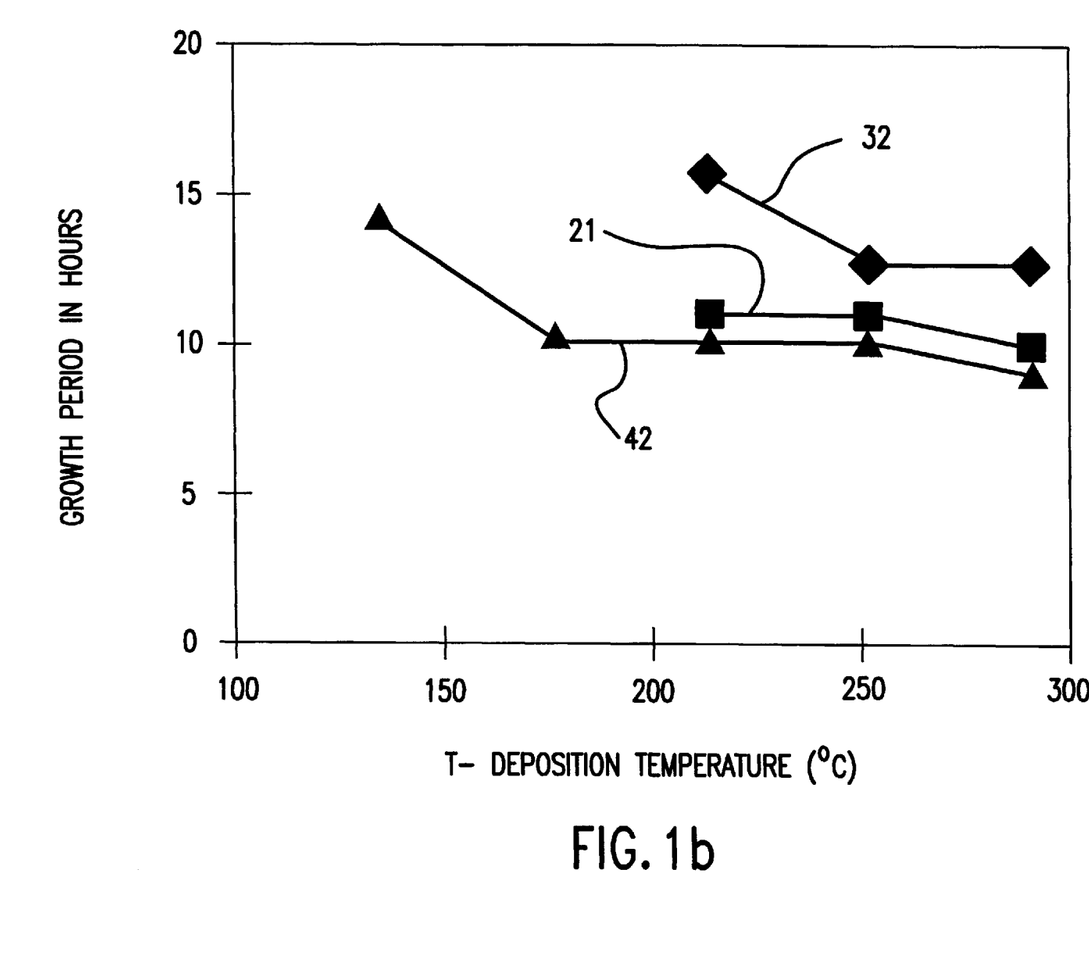
FIG. 1b crystal growth time as a function of deposition temperature for a-Si film deposited from three different source gases.
Figure 1C:
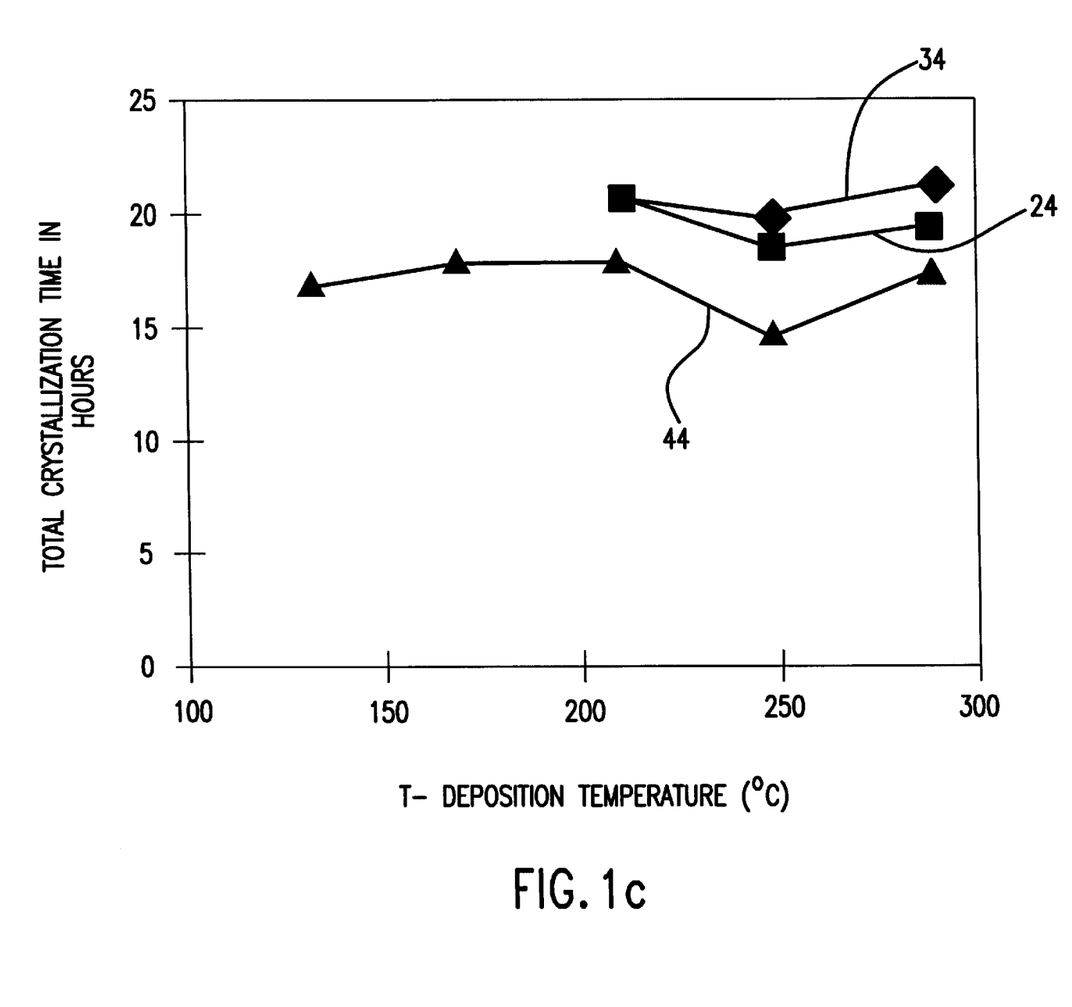
FIG. 1c shows total crystallization time as a function of deposition temperature for a-Si film deposed from three different source gases.

FIG. 1a is a plot of transient time, in hours, as a function of depositional temperature (T), in ° C. Curves 20, 30, and 40 represent data from source gases comprising $SiH_4$, $SiH_4:Ar$, and $SiH_4:H_2$, respectively. FIG. 1b is a plot of growth time, in hours, as a function of depositional temperature (T), in ° C. Curves 22, 32, and 42 represent data from source gases comprising $SiH_4$. $SiH_4:Ar$, and $SiH_4:H_2$, respectively. FIG. 1c is a plot of total crystallization time, in hours, as a function of depositional temperature (T), in ° C. Curves 24, 34, and 44 represent data from source gases comprising $SiH_4$, $SiH_4:Ar$, and $SiH_4:H_2$, respectively.

Referring first to FIG. 1c, it can be seen from the curves 24, 34 and 44 that the total crystallization time was found to be shorter for films deposited from a $SiH_4:H_2$ gas mixture, but did not exhibit a specific trend as a function of temperature. Next referring to FIG. 1b, it can be seen that the growth period, during which time the nucleation and grain growth process occurred, increased slightly with decreasing depositional temperature for all source gases used. The curves 32 and 42 illustrate that the growth period was longest for a $SiH_4:Ar$ source gas mixture, and was lowest for a $SiH_4:H_2$ source gas mixture, respectively FIG. 1a illustrates that the transient times for each of the source gases used followed no specific trend, as will be discussed subsequently.

Figure 2:
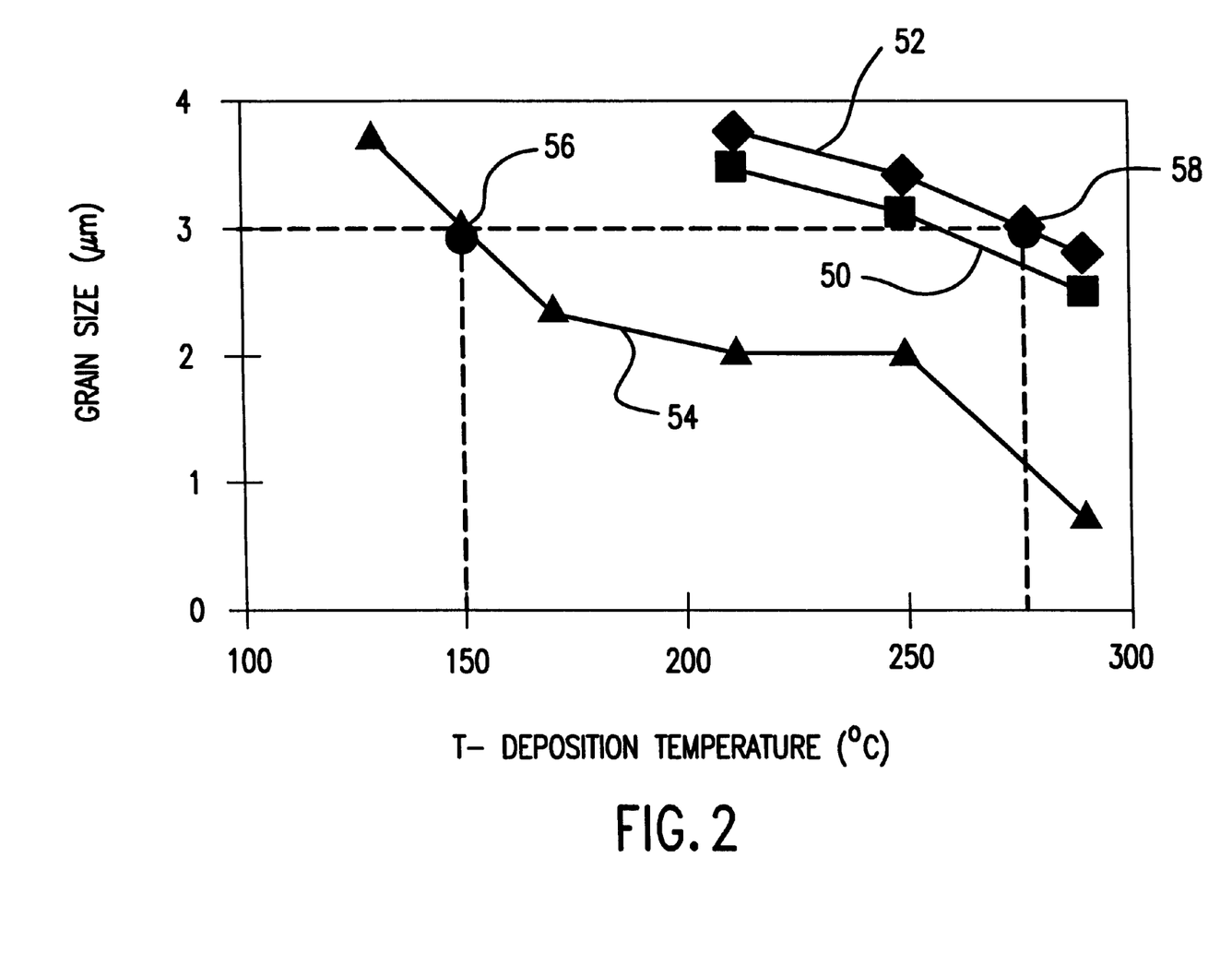
FIG. 2 shows grain size as a function of deposition temperature for a-Si film deposed from three different source gases.

Attention is directed to FIG. 2 which illustrates grain size as a function of depositional temperature T. Curves 50, 52, and 54 represent data from source gases comprising $SiH_4$, $SiH_4:Ar$, and $SiH_4:H_2$, respectively. The dilutions of $SiH_4:H_2$ and $SiH_4:Ar$ were 10:1. Grain size was calculated by averaging the largest twenty grains in a given TEM micrograph of each sample. The data in FIG. 2 clearly show that grain size increases as the depositional temperature is reduced, and that grain size is largest for $SiH_4:Ar$ source gas mixtures, and lowest for $SiH_4:H_2$ source gas mixtures.

Referring to FIG. 2 and FIG. 1a, it can be seen that deposition temperature T is reduced, and as the source gas mixture is changed from $SiH_4:H_2$ (curve 54) to pure $SiH_4$ (curve 50), or from $SiH_4$ to $SiH_4:Ar$ (curve 52), nucleation rate decreases. As an example, as T is reduced, the growth period (see FIG. 1b) and the average grain size (see FIG. 2) increase. Because the growth period increases, nucleation occur over a longer period of time, and because the average grain size increases, it follows that the total number of nuclei that form per unit area decreases. Thus the nucleation rate decreases. It is noted that these correlations between grain size, growth time, etc. and deposition parameters are not observed for the transient period (see FIG. 1), suggesting that the state of the film/glass interface dominates in determining transient time. From an applications viewpoint, it is noted that for a given depositional temperature, $SiH_4:Ar$ yields the largest grain size as illustrated by the curve 52 in FIG. 2.

The relative microvoid density, obtained from SE, for various films depicted in FIGS. 1a, 1b, 1c and 2 are presented in Table 1.

TABLE 1

Relative Microvoid Density for Various PECVD Conditions

| Deposition Temperature (° C.) | Source Gas Relative Mix | Microvoid Density |
|---|---|---|
| 290 | $SiH_4:H_2$ | 0.02 |
| 250 | $SiH_4:H_2$ | 0.04 |
| 130 | $SiH_4:H_2$ | 0.08 |
| 250 | $SiH_4$ | 0.05 |
| 250 | $SiH_4:Ar$ | 0.11 |

These results show that as deposition temperature is reduced from 290 to 250 to 130° C., or as the source gas mix is changed from $SiH_4:H_2$ to pure $SiH_4$, or from pure $SiH_4$ to $SiH_4:Ar$, the relative microvoid density increases. Furthermore, it is well known that as the depositional temperature is reduced, or as the deposition rate is increased (which is the case corresponding the source gas mixture from $SiH_4:H_2$ to pure $SiH_4$, or from pure $SiH_4$ to $SiH_4:Ar$), the structural disorder in the resulting a-Si increases. Thus, these results, coupled with those presented above, illustrate that, as the structural disorder in the a-Si film increases, then the resulting nucleation rate decrease and the grain sizes increases correspondingly.

Based upon the above discussion, the present invention provides functional relationships between both deposition temperature and source gas dilution with subsequent crystallization parameters. As a result, grain size and thermal budget can be controlled in the fabrication of poly-Si films. An acceptable grain sizes and thermal budget is established for the fabrication process. Source gas and deposition temperature is then provided to meet the grain size and thermal budget criteria.

Examples of the methodology of the invention are illustrated in FIG. 2. First assume that a grain size of 3 micrometers ($\mu$m) is required and a deposition temperature of 275° C. is selected. Orthogonal extensions from these values on the ordinate and abscissa of the Graph of FIG. 2 intersect at a point 58 which falls on the curve 52 indicating that $SiH_4:Ar$ must be used as a source gas. Next assume that a grain size of 3 $\mu$m is again desired, and a source gas of $SiH_4:H_2$ is to be used. A horizontal extension from the ordinate at 3 $\mu$m intersects the curve 54 at a point 56. A vertical projection from the point 56 to the abscissa indicates that a deposition temperature of 150° C. is required to produce a film with grain size of 3 $\mu$m using a $SiH_4:H_2$ source gas.

Effects of Pre-Anneal Surface Treatments

Attention is next directed to the effects of pre-anneal surface treatments upon the properties of thin a-Si films. Pre-annealing surface treatments were compared for a-Si film deposited from both hydrogen and argon diluted silane. More specifically, crystallization time and grain size of resulting poly-Si films were determined a function of deposition temperature for several source gas mixes and several applied pre-anneal surface treatments.

TABLE 2

Grain size and Crystallization times for a-Si Films Subjected to Various Pre-Annealing Surface Treatments

| Dep. Temp (° C.) | Source Gas Mix | Pre-Anneal Treatment | Cryst. Time (hrs) | Grain Size (um) |
|---|---|---|---|---|
| 250 | $SiH_4:H_2$ | none | 18 | 2.5 |
|  |  | He plasma | 14 | 2.5 |
|  |  | $N_2$ plasma | 8 | 0.9 |
|  |  | Au metal | ~0.5 | 1.3 |
|  |  | Ni metal | ~0.08 | 0.16 |
|  |  | Pd metal | ~0.25 | ~0.05 |
| 130 | $SiH_4:H_2$ | none | 17 | 3.8 |
|  |  | Au metal | <0.5 | ~0.05 |
|  |  | Ni metal | <0.5 | 0.15 |
|  |  | Pd metal | <0.5 | ~0.07 |
| 250 | $SiH_4:Ar$ | none | 18 | 3.7 |
|  |  | Pd metal | ~0.08 | ~0.08 |

The data in Table 2 clearly show that metal-catalyzed crystallization treatments of various diluted films has a very dramatic impact on crystallization time. The reductions in crystallization time are much larger than any reductions seen previously in the prior art on non-diluted films. This observation suggests synergism between these metal treatments and source gas dilution. Furthermore, data in Table 2 show that, in general, the greater reduction in thermal budget, the greater reduction in grain size, for both metal and plasma pre-annealed surface treatments. Pre-annealing, therefore, creates a trade-off situation between desired increased grain size and the desired decreased thermal budget.

Prior art studies have concluded from experimental observations that Ni and Pd overlays result in the formation of a silicide at a relatively low temperature (~350° C.), and that this silicide induces nucleation. The reduction in thermal budget resulting from pre-annealing plasma surface treatments has also been studied in the prior art, however these studies did not use diluted films. It was postulated in these studies that plasma treatments increase the stored energy in the surface of the a-Si film, in the form of strained and broken Si—Si bonds. This energy then aids the nucleation process upon annealing. The data in Table 2 show that plasma treatments on diluted films produce almost the same reduction in crystallization time, and hence reduction in thermal budget, reported in prior art plasma treatments of non-diluted films. Methods of the present invention show, however, that the metal treatments dramatically lower the crystallization times much more so than for this treatment on non-diluted films.

Effects of Annealing Technique and Temperature

Attention is now directed toward the effects of annealing technique and temperature of the thin film.

Properties of a-Si films deposited from a $SiH_4$:Ar source gas at a given depositional temperature T=210° C. were determined as a function of annealing temperature, $T_a$, where the films were annealed in both a conventional furnace and RTP systems.

Figure 3A:
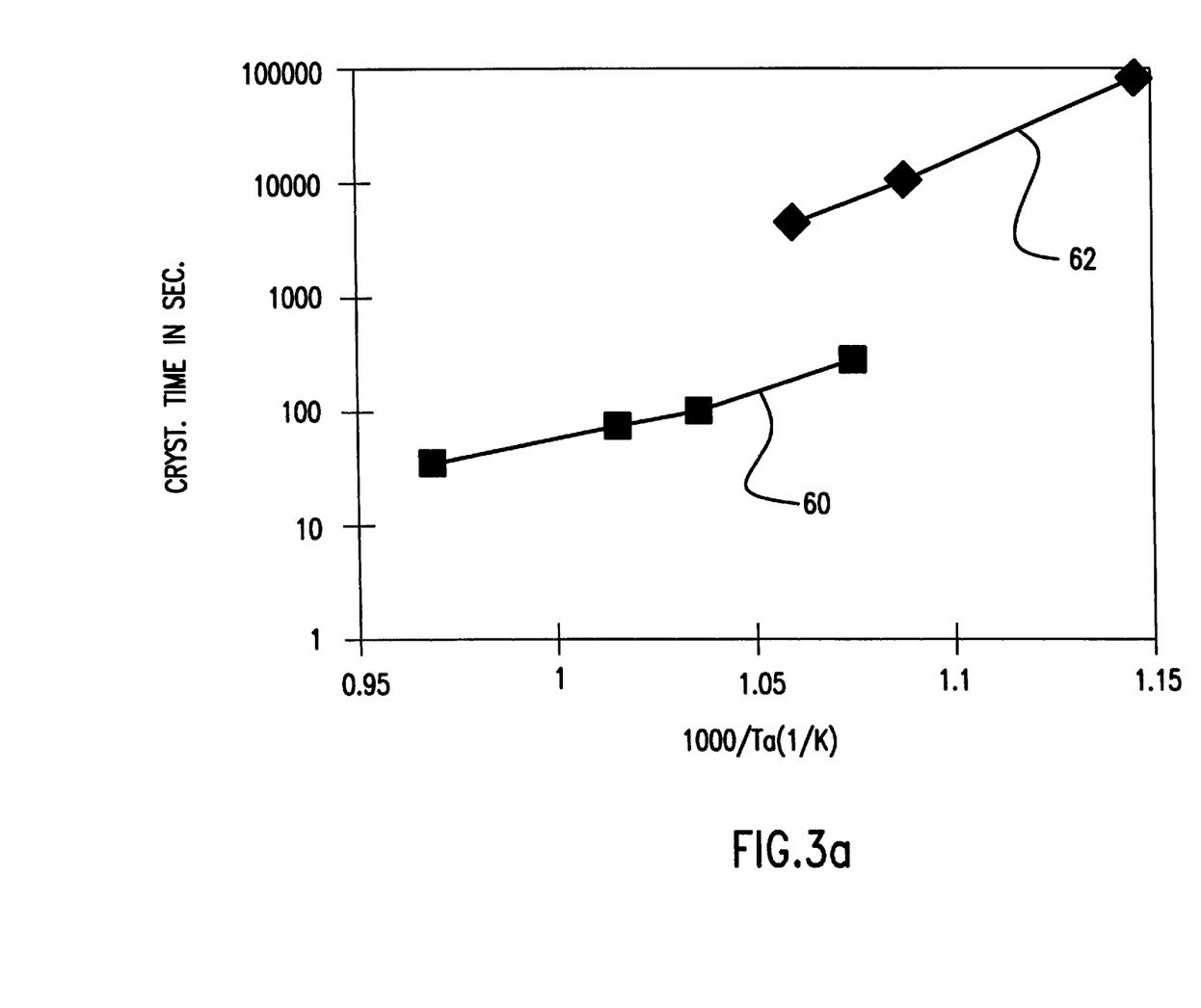
FIG. 3a is a plot of crystallization time for a-Si film as a function of the inverse of annealing temperature, for annealing using a conventional furnace and for RTP annealing using tungsten-halogen light.

FIG. 3a illustrates crystallization time measured as a function at $1000/T_a$, where $T_a$ is in degrees Kelvin (° K.). Curve 62 represents data from film annealed in a conventional furnace, and curve 60 represents data from film annealed in a RTP system. FIG. 3a illustrates that for either furnace annealing or RTA, the crystallization time is a temperature activated process, where crystallization time is proportional to $\exp(-E/kT_a)$, where E is the crystallization activation energy and k is Boltzmann's constant. Furthermore, these data show that the resulting poly-Si grain size is inversely proportional to the annealing temperature. Both of these phenomena have been observed in the prior art, and can be explained by considering nucleation and grain growth kinetics.

Figure 3B:
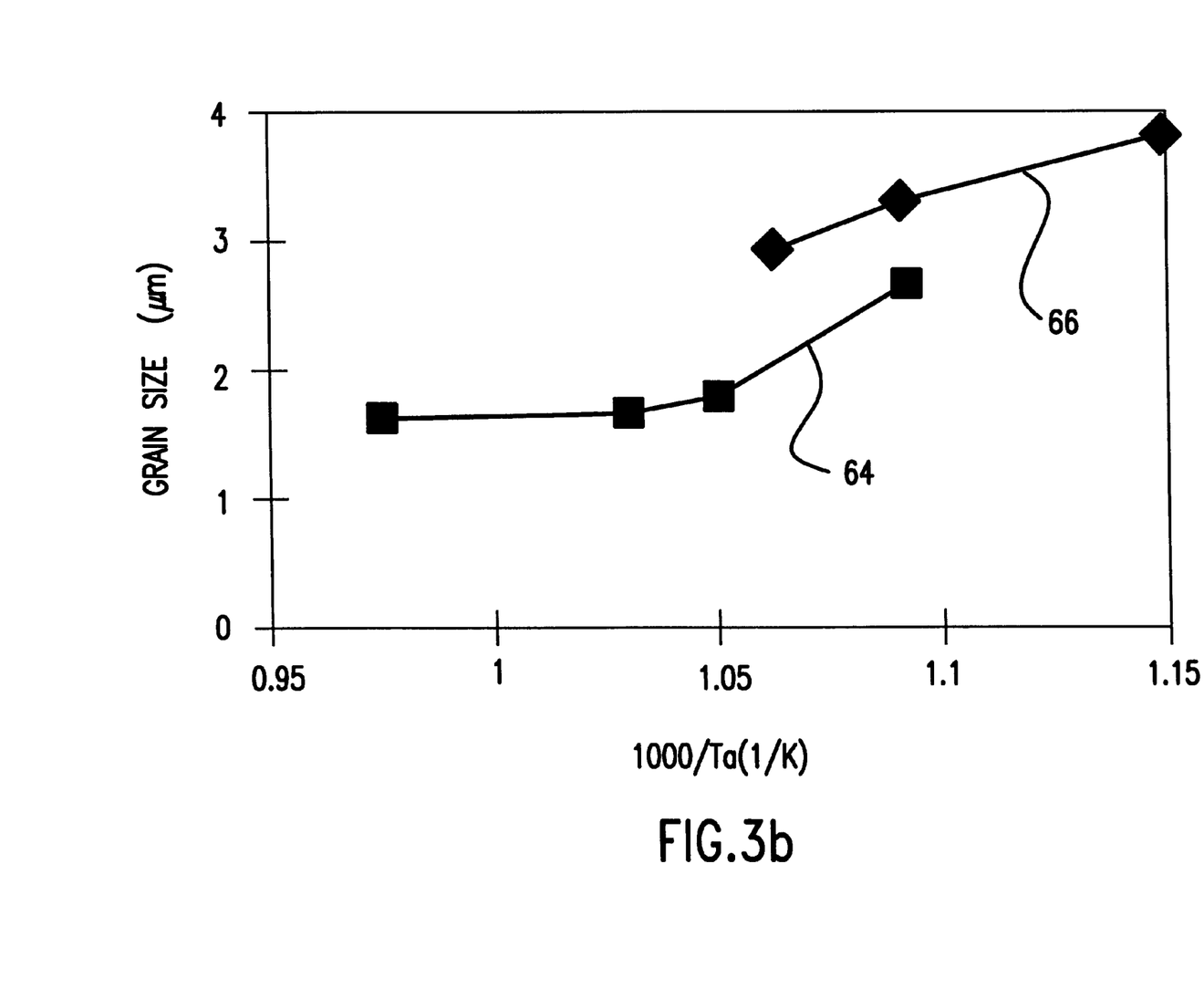
FIG. 3b is a plot of grain size for a-Si film as a function of the inverse of annealing temperature for annealing using a conventional furnace, and for RTP annealing using tungsten-halogen light.

FIG. 3b is a plot of grain size, measured as a function of $1000/T_a$, for a-Si films deposited from a $SiH_4$:Ar source gas at a given deposition temperature T=210° C. Curve 66 represents annealing with a conventional furnace, and curve 64 represents annealing in a RTP system. FIG. 3b illustrates that for a given annealing temperature $T_a$, grain size is reduced by annealing in a RTP system.

FIGS. 3a and 3b show that RTA results in reduced crystallization time (thus reduced thermal budget), but at the expense of smaller grain size. Two explanatory models are set forth.

The first model is based on the fact that the light spectra present during the annealing in the two systems are different. The RTP system uses tungsten-halogen lamps to heat the a-Si film, whereas the conventional furnace annealing heats the sample by resistive coil heating of the whole environment. The light spectrum present during rapid thermal annealing is much more energetic and intense than that present during furnace annealing. Because of this, it is proposed that the energetic photons present during rapid thermal annealing create photocarriers which subsequently recombine and thereby break weak and strained bonds in the a $Si:H_4$ film. These sites then serve as recombination centers for further photocarriers and thereby produce local heating. The locations at which this localized heating occurs then become favorable sites for nucleation. This results in the ability for nuclei to form more readily, which results in a higher nucleation rate and hence a shorter crystallization time as shown in FIG. 3a. A direct result of this increased nucleation rate is the reduction in grain size that is illustrated in the plots of FIG. 3b.

The second model proposed to explain the reduction in thermal budget and resulting grain size from rapid thermal annealing compared to furnace annealing is based upon the sudden release of stored energy within the a-Si:H film. Experimental observations in the prior art literature illustrate that stored energy in amorphous films could be released resulting in "explosive" crystallization. Specifically, relatively thick Ge films deposited by sputtering can be crystallized by simply "pricking" the surface of the film with a sharp object. Based upon these experimental observations, earlier investigators concluded that once the crystallization process was triggered by pricking, the free energy released as the difference in the free energy between the amorphous and the crystalline state, was sufficient to drive the crystallization of the remaining film. Based upon these results from the prior art literature, it is proposed in this disclosure that the sudden heating of the a-Si:H thin film that occurs during rapid thermal annealing is the "pricking" that results in the sudden release of stored energy in the form of heat. This excess heat results in a higher "effective" temperature which drives the nucleation and grain growing process. In the same way that grain size decreases with increasing annealing temperature as shown in FIG. 3b for both annealing methods. RTA annealing at a given $T_a$ yields smaller grain size simply because of the higher "effective" temperature which affects the film resulting from the sudden release of stored energy within the film. Although this energy must also be released during furnace annealing, it is released over a long period of time because the annealing process is relatively slow. This slow release of energy does not have the same impact that occurs in the rapid thermal annealing process.

The present disclosure sets forth methodology which relates grain size to the method of annealing, for a given annealing temperature $T_a$. Again, a trade off situation arises between maximum grain size and minimum annealing temperature, but again, the present disclosure presents the fabricator with methodology for controlling grain size within the constraints of acceptable thermal budget.

Enhanced RTP Annealing

The source of the RTA system is not limited to the previously mentioned tungsten-halogen (T-H) source, A xenon lamp has also been used as a heat source, with advantages to be set forth below. The T-H and xenon sources differ only in the intensity and the energy spectrum of the radiated light.

Figure 4:
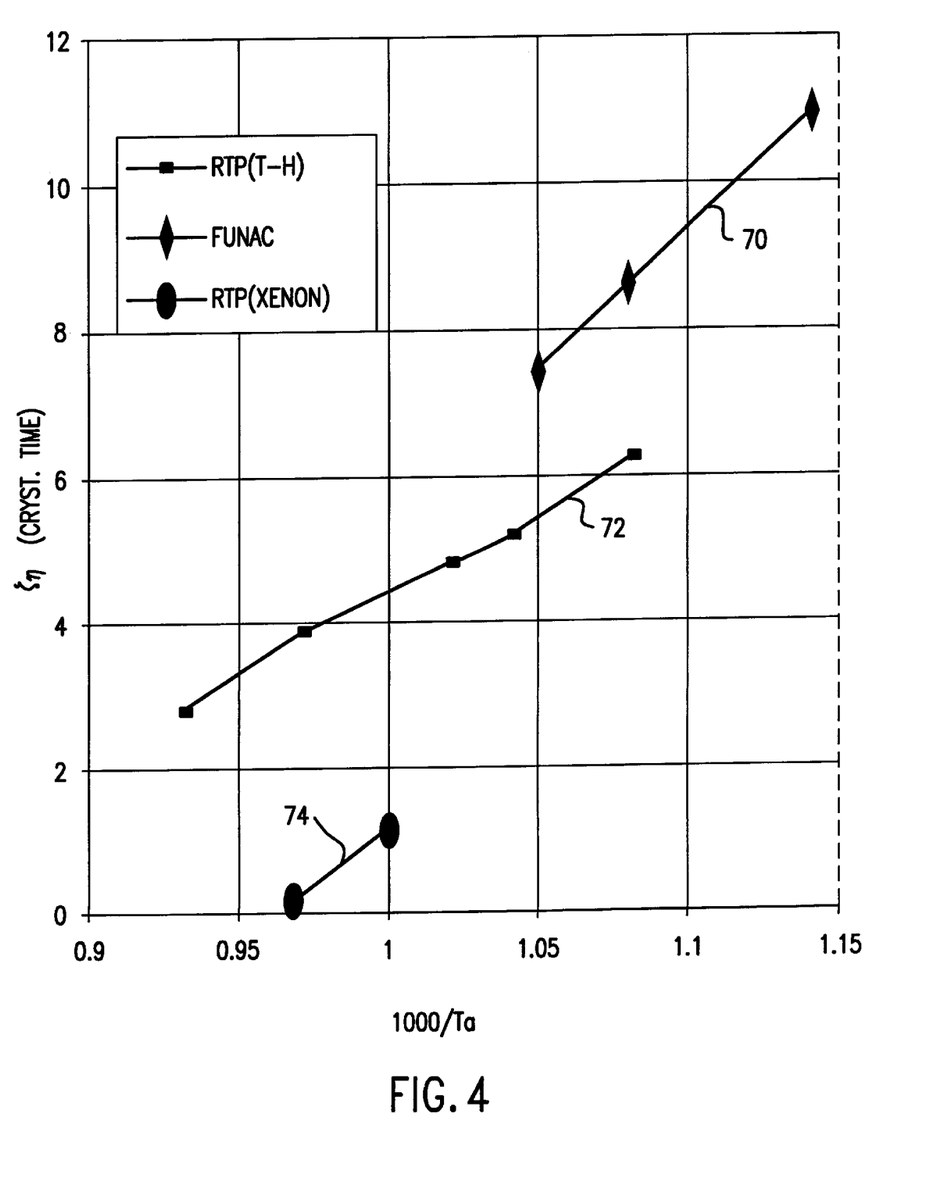
FIG. 4 is a plot of the natural logarithm of crystallization time as a function of the inverse of annealing temperature for annealing using a conventional furnace, RTP annealing using tungsten-halogen, and RTP annealing using xenon.

The efficiencies of three annealing techniques for a-Si film using a conventional furnace, RTP using a T-H lamp, and RTP using a xenon lamp have been compared and presented graphically in FIG. 4. This graph presents the natural logarithm of the crystallization time plotted as a function of $1000/T_a$, where again $T_a$ is the annealing temperature in ° K. Curves 70, 72 and 74 represent data from annealing with a conventional furnace, a RTP with T-H source, and a RTP with xenon source, respectively. It can be seen that for a given temperature $T_a$, the xenon source crystallizes the a-Si film much more quickly than the RTP with the T-H source, which in turn is faster than the conventional furnace.

It is thought that the data presented in FIG. 4 can be directly correlated with the differences in the radiation spectrum for each source. From this observation, it can be concluded that high energy, high intensity radiation present during the xenon RTA crystallization process reduces the time and/or temperature required for full crystallization of a a-Si film. It is again thought that the response of the xenon RTA process is due to one or more of the two previously discussed enhancement mechanisms, namely (1) the breaking of Si—Si and Si—H bonds by the higher energy photons from xenon, or by hot carriers produced by these photons, and (2) the generation of recombination states within the energy gap, through which photocarriers recombine, resulting in a very localized heating mechanism which aids in the nucleation process.

Additional Applications

It should be understood that means for enhanced annealing is not limited to the above described xenon light source. A general photon spectrum, augmented by high energy photons of much greater density than any black body temperature characterizing the general spectrum, can be designed to set up the two previously discussed crystallization enhancement mechanisms. This enhancement approach has been shown to enhance crystallization of amorphous materials such as a-Si into poly-Si films. It is also thought that the same means and methods can be used in a number of other processes used in the display, microelectronics, and solar cell industries. As more specific examples, a RTP source rich in high energy, high intensity photon radiation offers advantages in other processes such as dopant diffusion, oxide growth, dopant activation, gate oxide densification, and any process in which the atomic nature of a material is to be modified.

Selective Crystallization

Figure 5:
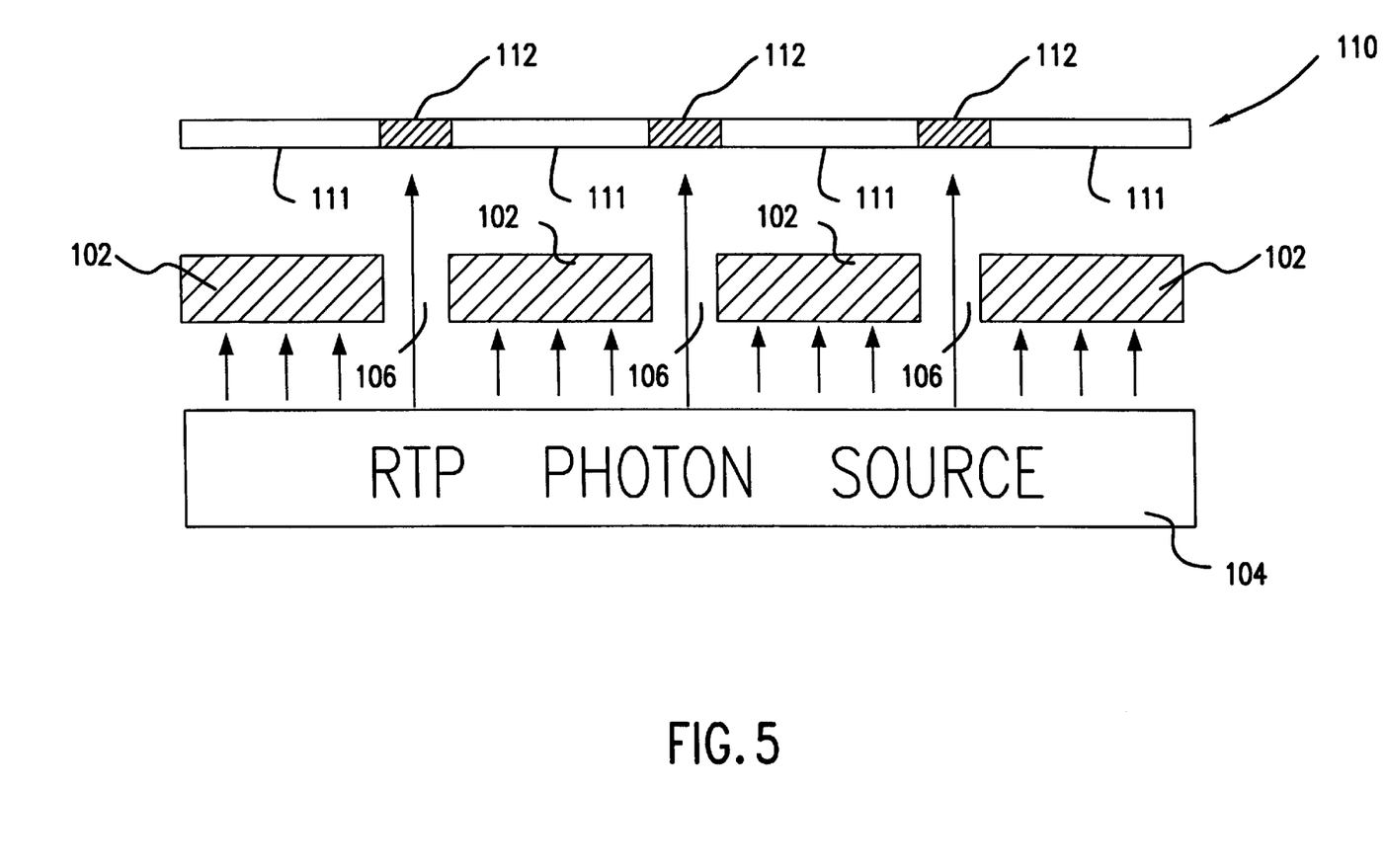
FIG. 5 illustrates functional apparatus for selective crystallization of an amorphous film using photon enhanced RTA and a shadow mask.

It is often advantageous to perform selective crystallization of amorphous silicon, thereby producing regions of poly-Si and regions of a-Si on the same substrate. Attention is directed to FIG. 5 which shows a substrate which is initially a-Si and which is identified generally by the numeral 110. Selective crystallization is achieved by confining the general spectrum of high energy, high intensity radiation from a RTP photon source 104 to certain regions of the initially a-Si film 110. This can be accomplished by optical confinement such as a shadow mask 102 with passage ways 106 therein. Photon radiation from the source 104 passes through the open passages 106 in the mask 102 and impinges upon the initially a-Si film 110 forming regions 112 of poly-Si on the film, and leaving other regions 111 not irradiated by the photon source as a-Si. It should be understood that the illustration in FIG. 5 is conceptual, and many other means and methods can be used to obtain selective crystallization of an a initially amorphous film. As an example, photon interference patterns rather than shadow masks can be used to confine photon radiation areas of impingement.

Another advantage obtainable from the selective crystallization process is large grain poly-Si films. By selectively crystallizing small, strategically placed regions of an a-Si film using the technique outlined above, large grains can be achieved by using the small polycrystalline regions as seed nuclei, resulting in single grains emerging from the locations of the seed nuclei, and growing until adjacent grains impinge upon each other, resulting in grain sizes of the order of the distance between adjacent seed nuclei. The utilization of high intensity, high energy photon radiation in the RTP annealing process causes athermal components of this process, and that results in the decrease in thermal budget for crystallization, as demonstrated in FIG. 4. Prior art RTP annealing applications rely on apparatus and methods for producing extremely high heating rates, extremely high temperatures, and extremely high cooling rates, and do not rely on high energy, high intensity auxiliary photon fluxes in the process. Prior art processes require, therefore, a much higher thermal budget for crystallization.

SUMMARY

In summary, the PECVD deposition conditions affect the SPC kinetics of a-Si thin films. As the deposition rate is increased, or as the source gas mixture is changed from $SiH_4$:$H_2$ to pure $SiH_4$, or from pure $SiH_4$ to $SiH_4$:Ar, the nucleation rate decreases resulting in an increase in grain size. In addition, thermal budget reduction is offered by pre-anneal surface treatments when applied to diluted films. The thermal budget reduction occurs as a result of enhanced nucleation rate which, in turn, results in smaller poly-Si grain size thereby creating a trade-off situation. RTA has been found to modify the kinetics of SPC, where in general terms, RTA reduces the thermal budget, at the expense of smaller grain size, when compared to furnace annealing at the same given annealing temperature. RTA enhanced with a flux of high energy, high intensity photons is used to further reduce the thermal budget. Selective crystallization of amorphous film using photon enhanced RTA can he used to form seed nuclei from which relatively large grains of polycrystalline material grow with a relatively small thermal budget.

The disclosed methods and apparatus meet all of the stated objects of the invention. While the foregoing disclosure is directed to the preferred embodiments of the invention, the scope thereof is determined by the claims which follow.

What is claimed is:

1. A method for fabricating polycrystalline semiconductor thin film, comprising the steps of:

(a) depositing, at a controlled deposition temperature, an amorphous semiconductor thin film;

(b) annealing, said amorphous semiconductor thin film by means of a rapid thermal anneal through use of a selected light source, said selected light source, when adjusted to heat said amorphous semiconductor thin film to a predetermined temperature, emitting a flux of high energy photons that drive a crystallization enhancement mechanism in said amorphous semiconductor thin film, said selected light source having a general spectrum characterized by a black body temperature and high energy photons, and chosen so that said flux of high energy photons emitted therefrom is greater than a flux of high energy photons emitted by a tungsten halogen light source when said tungsten halogen light source is used to heat said amorphous semiconductor thin film to said predetermined temperature, thereby crystallizing said amorphous film to form said polycrystalline semiconductor thin film.

2. The method of claim 1 wherein said semiconductor is silicon and depositing step a) employs a silicon-bearing source gas and a dilutant.

3. The method of claim 1, further comprising contacting said amorphous thin film of semiconductor with a thin layer of crystallization promoting metal.

4. The method of claim 3 wherein said metal comprises nickel.

5. The method of claim 3 wherein said metal comprises gold.

6. The method of claim 3 wherein said metal comprises palladium.

7. The method of claim 1, wherein said selected light source comprises a xenon lamp.

8. The method of claim 2, wherein said dilutant comprises argon.

9. The method of claim 2, wherein said dilutant comprises hydrogen.

* * * * *